US006292362B1

United States Patent
O'Neal et al.

(10) Patent No.: US 6,292,362 B1
(45) Date of Patent: Sep. 18, 2001

(54) SELF-CONTAINED FLOWABLE THERMAL INTERFACE MATERIAL MODULE

(75) Inventors: Sean P. O'Neal, Round Rock; Reynold L. Liao; Phillip Gilchrist, both of Austin, all of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/470,281

(22) Filed: Dec. 22, 1999

(51) Int. Cl.[7] .................................................. G06F 1/20
(52) U.S. Cl. ..................... 361/687; 361/695; 454/184; 165/122; 165/80.3
(58) Field of Search ..................... 361/687, 695, 361/697, 685, 699–700; 454/184, 353; 248/240, 291.1, 225.11; 165/80.3, 80.4, 104.33, 122–126; 174/15.2, 16.3

(56) References Cited

U.S. PATENT DOCUMENTS

| 5,528,462 | * | 6/1996 | Pendse | 361/767 |
| 5,568,360 | | 10/1996 | Penniman et al. | 361/687 |
| 5,796,582 | * | 8/1998 | Katchmar | 361/704 |
| 5,856,911 | * | 1/1999 | Riley | 361/704 |
| 6,016,006 | * | 1/2000 | Kolman et al. | 257/712 |
| 6,134,116 | * | 10/2000 | Hoss et al. | 361/747 |

* cited by examiner

*Primary Examiner*—Gerald Tolin
*Assistant Examiner*—Hung Van Duong
(74) *Attorney, Agent, or Firm*—Haynes and Boone, L.L.P.

(57) ABSTRACT

A self-contained flowable thermal interface material module includes a carrier having opposite sides and a continuous peripheral edge. A thermal interface material is mounted on the carrier. A portion of the interface material is exposed on each of the opposite sides. A continuous gasket is mounted on the carrier and is also exposed on each of the opposite sides. The gasket is positioned between the interface material and the peripheral edge. The module may be positioned between a heat generating component and a heat sink so that a portion of the gasket seals with the heat generating component, and a portion of the gasket seals with the heat sink to form a reservoir for retaining the heated flowable interface material. In this manner, the gasket contains a reservoir of the thermal interface material in contact with the heat generating component and with the heat sink throughout continuous periods of thermal cycling.

13 Claims, 3 Drawing Sheets

SELF-CONTAINED FLOWABLE THERMAL INTERFACE MATERIAL MODULE

BACKGROUND

The disclosures herein relate generally to computer systems and more particularly to establishing a thermal bond with a thermal interface material for computer system components.

To establish a good thermal bond between two mechanically fastened parts, a thermal interface material is needed to ensure maximum surface to surface contact. There are three types of industry standard thermal interface materials including a thermal pad, phase change material and thermal grease. In comparison to the thermal pad, thermal grease and phase change thermal interface material can have up to 10 times less thermal resistance. The reason for this is partially because the thermal grease and the phase change material are "flowable" materials. They flow to conform to all surface imperfections to achieve maximum thermal bonding.

Although the Flowable Thermal Interface Material (FTIM) works well, the measured application is difficult in a mass production environment. The key to applying the FTIM is to apply an accurate amount on the proper area. Presently, there is no known method to perform the accurate volumetric measurement and positioning of the thermal grease on the central processing unit (CPU) die on the computer production line. Occasionally, a system requires CPU replacement in the field. If the system uses a FTIM between the CPU and the heat block, the FTIM will need to be replaced when the CPU is replaced. In the field service scenario, the accurate application of the FTIM is even more difficult. Currently, experienced, trained operators perform the application of the flowable thermal interface material, which is not well controlled in terms of volume or location of the material Also, if a gasket is to be used to limit depletion of the FTIM, the originally installed gasket will take a thermal set after a period of time and cannot be satisfactorily re-used if aftermarket replacement is required.

Thermally compliant material is disclosed in U.S. Pat. No. 5,568,360. A heat transfer system is provided for dissipating thermal energy within a personal computer. The transfer system is designed to move heat from a heat source, such as a CPU, to a heatsink arranged upon the portable computer keyboard. The heat transfer mechanism includes a heat slug thermally coupled to the CPU heat source and a heat pipe thermally coupled to a backside surface of a computer keyboard. The heat pipe is designed having minimal thermal gradient, and includes an evaporation/condensation cycle associated with its operation. The heat pipe is preferably orthogonally shaped having at least one flat surface arranged near the intersection of the orthogonal members. The flat section is in registry with a heat source. Movement of the flat section relative to the heat source effectuates abutment and thermal contact therebetween. The present thermal energy transfer system is designed for enhanced heat transfer within a portable computer system without undergoing the disadvantages of bulky finned heatsinks and/or fans.

Therefore, what is needed is a self-contained flowable thermal interface material module which retains the interface material in a reservoir and which can be installed as original equipment or as a replacement part.

SUMMARY

One embodiment, accordingly, provides a pre-measured FTIM carrier which can be positioned adjacent a heat generating component and a heat sink. To this end, a thermal interface material module includes a carrier having opposite sides and a peripheral edge. A thermal interface material is mounted on the carrier such that a portion of the interface material is exposed on each of the opposite sides of the carrier. A gasket is mounted on the carrier and is exposed on each of the opposite sides. The gasket is positioned between the interface material and the peripheral edge.

A principal advantage of this embodiment is that a pre-measured FTIM carrier can be provided for assembly line use and for aftermarket use. Also, the carrier can be provided with a positioning feature for accurate referencing.

BRIEF DESCRIPTION OF THE DRAWING FIGURES

DETAILED DESCRIPTION

Figure 1:
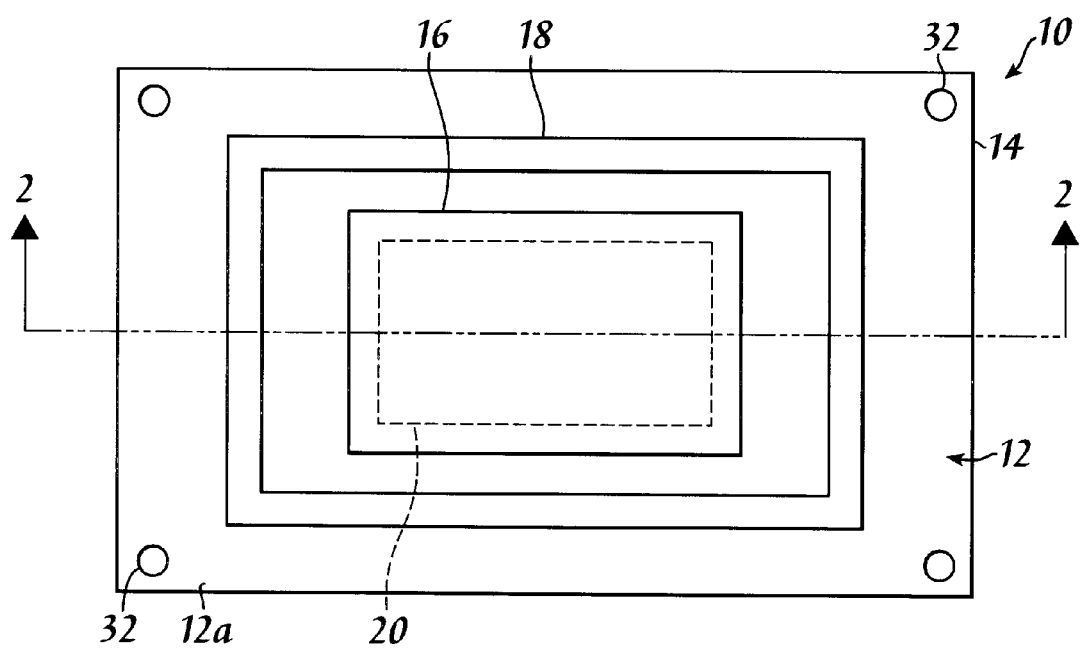
FIG. 1 is a plan view illustrating an embodiment of a thermal interface material module.
Figure 2:
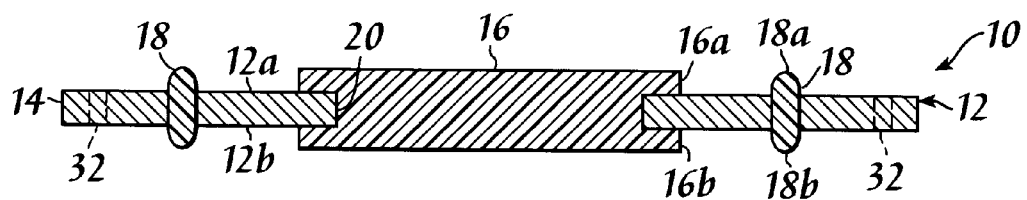
FIG. 2 is a cross-sectional view taken along the line 2—2 of FIG. 1.

A thermal interface material module 10 is illustrated in FIGS. 1 and 2 and includes a carrier 12 having opposite sides 12a, 12b and a peripheral edge 14. The carrier 12 is generally in the shape of a rectangle but may be of any suitable shape. The material used to form the carrier 12 is preferably a suitable high temperature plastic.

A thermal interface material 16 is mounted on the carrier 12 such that a portion 16a of the interface material 16 is exposed on side 12a of the carrier 12, and a portion 16b of the interface material 16 is exposed on side 12b of the carrier 12. The thermal interface material 16 is preferably a suitable thermal grease which becomes flowable when heated.

A gasket 18 is mounted on the carrier 12 and is exposed on each of the opposite sides 12a, 12b of the carrier 12. The gasket 18 is positioned between the thermal interface material 16 and the peripheral edge 14. The gasket 18 is preferably formed of a compressible sealing material such as silicone.

The carrier 12 includes an opening 20 formed therethrough and the thermal interface material 16 is mounted in the opening 20 such that portion 16a of the interface material 16 extends from the side 12a and portion 16b of the interface material 16 extends from the opposite side 12b. A portion 18a of the gasket 18 extends from the side 12a of the carrier 12 and a portion 18b of the gasket 18 extends from the side 12b of the carrier 12. The gasket portions 18a, 18b each form a continuous barrier surrounding the interface material 16 on respective sides 12a, 12b of the carrier 12.

Figure 3:
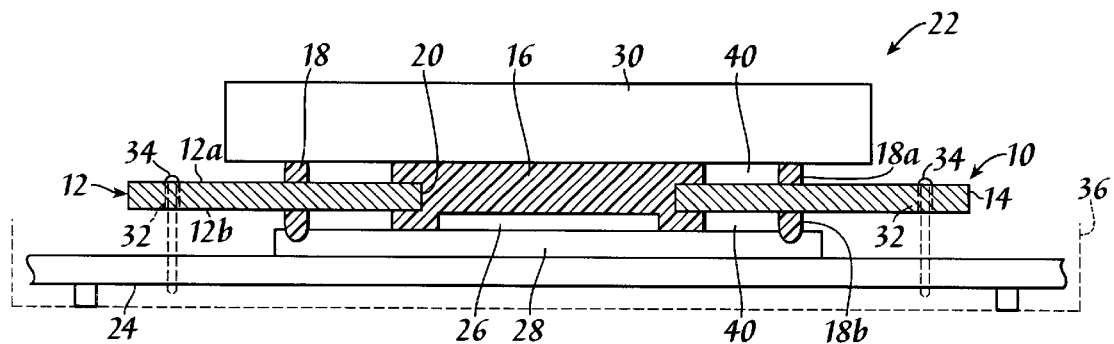
FIG. 3 is a side view illustrating an embodiment of the module in cross-section mounted in a chip assembly.
Figure 4:
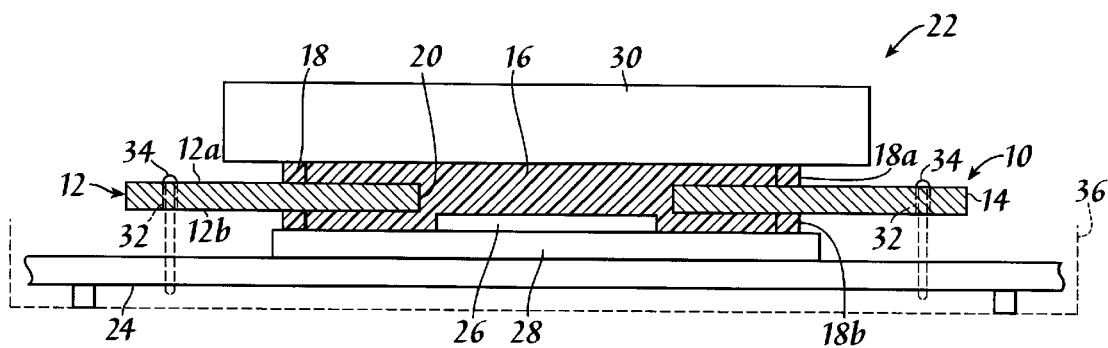
FIG. 4 is another side view illustrating an embodiment of the module in cross-section mounted in the chip assembly.

The thermal interface material module 10, FIGS. 3 and 4 is self-contained for use in original equipment and for aftermarket use to replace the original module 10. The module 10 may be installed in a chip assembly 22 which includes a circuit board 24 having a heat generating component 26, such as a central processing unit (CPU) which includes a base portion 28. The base portion 28 is mounted on the circuit board 24 by plugging into a socket (not shown) on the circuit board 24. Thus, the self-contained flowable thermal interface material module 10 is mounted on the heat generating component 26. The carrier 12 includes side 12a, side 12b, and the opening 20 formed therethrough including the continuous peripheral edge 14. The thermal interface material 16 is mounted in the opening 20 and is exposed on the sides 12a, 12b of the carrier. The interface material 16 is in contact with the heat generating component 26 adjacent side 12b of the carrier. The gasket 18 is mounted on the carrier 12 such that the portion 18b of the gasket 18 is sealingly engaged with base portion 28 of the heat generating component 26 and is positioned between the interface material 16 and the peripheral edge 14. A heat sink 30 is engaged with the interface material 16 adjacent the side 12a of the carrier 12. The portion 18a of the gasket 18 is sealingly engaged with the heat sink 30 and is positioned between the interface material 16 and the peripheral edge 14. Thus, the portions 18a, 18b of the gasket 18 form a continuous barrier surrounding the interface material 16 on the opposite sides 12a, 12b of the carrier 12.

A plurality of positioning apertures 32, FIGS. 1–4, may be formed in the carrier 12. In this manner, the carrier 12 may be positioned with the component 26 so that the interface material 16 is aligned to engage the component 26. A plurality of fastener members 34, FIGS. 3 and 4, may be used to insert through the apertures 32 and attach the carrier 12 to the circuit board 24. The circuit board 24 is mounted in a computer chassis 36.

Figure 5:
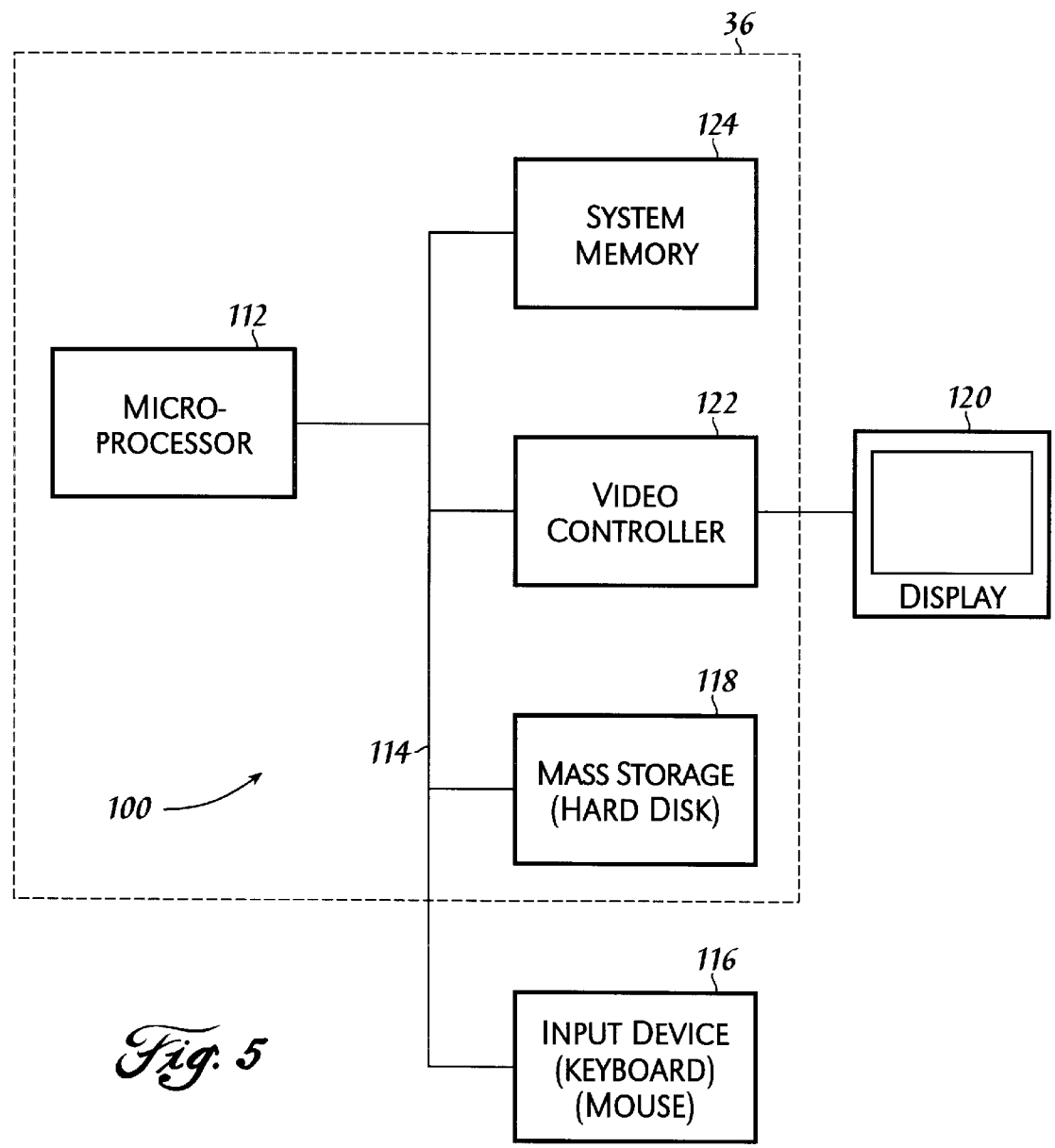
FIG. 5 is a diagrammatic view illustrating an embodiment of a computer system.

The module may be used in a computer system 100, FIG. 5. The computer system 100 includes a microprocessor 112, which may include CPU 26, which is connected to a bus 114. Bus 114 serves as a connection between microprocessor 112 and other components of computer system 100. An input device 116 is coupled to microprocessor 112 to provide input to microprocessor 112. Examples of input devices include keyboards, touchscreens, and pointing devices such as mouses, trackballs and trackpads. Programs and data are stored on a mass storage device 118, which is coupled to microprocessor 112. Mass storage devices include such devices as hard disks, optical disks, magneto-optical drives, floppy drives and the like. Computer system 100 further includes a display 120, which is coupled to microprocessor 112 by a video controller 122. A system memory 124 is coupled to microprocessor 112 to provide the microprocessor with fast storage to facilitate execution of computer programs by microprocessor 112. It should be understood that other busses and intermediate circuits can be deployed between the components described above and microprocessor 112 to facilitate interconnection between the components and the microprocessor.

The circuit board 24, FIGS. 3 and 4, is mounted in the chassis 36 and the heat generating component 26 is mounted on the circuit board 24. The self-contained flowable thermal interface material module 10 is mounted on the heat generating component 26. The thermal interface module 10 is provided for use in the computer system 100. The carrier 12 is mounted adjacent the component 26. The carrier 12 includes the opposite sides 12a, 12b, and opening 20 formed therein. The flowable thermal interface material 16 is mounted in the opening 20 to extend from the opposite sides 12a, 12b. A portion 16b of the interface material 16 engages the component 26. The gasket 18 is mounted on the carrier 12 to extend from the opposite sides 12a, 12b. The gasket 18 is positioned between the interface material 16 and the continuous peripheral edge 14 of the carrier 12. The gasket portion 18b is sealingly engaged with the component 26. The heat sink 30 is adjacent the carrier 12 and is sealingly engaged with the gasket portion 18a. Upon heating, the interface material 16 becomes flowable, FIG. 4. The gasket portions 18a, 18b form a continuous sealing barrier surrounding the interface material 16 on the opposite sides 12a, 12b of the carrier 12 and thus form a reservoir 40, FIG. 3, to contain the flowable interface material 16, FIG. 4, engaged with the component 26 on one side 12b of the carrier 12, and to contain the flowable interface material 16 engaged with the heat sink 30 on the opposite side 12a of the carrier 12.

As a result, one embodiment provides a thermal interface material module including a carrier having opposite sides and a peripheral edge. A thermal interface material is mounted on the carrier. A portion of the interface material is exposed on each of the opposite sides. A gasket is mounted on the carrier and exposed on each of the opposite sides. The gasket is positioned between the interface material and the peripheral edge.

Another embodiment provides a self-contained flowable thermal interface material module including a carrier having opposite sides, an opening formed therethrough, and a continuous peripheral edge. A thermal interface material is mounted in the opening and exposed on each of the opposite sides. A gasket is mounted on the carrier and exposed on each of the opposite sides. The gasket is positioned between the interface material and the peripheral edge.

A further embodiment provides a chip assembly including a circuit board, a heat generating component mounted on the circuit board, and a self-contained flowable thermal interface material module mounted on the component. The module includes a carrier having a first side, a second side, an opening formed therethrough and a continuous peripheral edge. A thermal interface material is mounted in the opening and exposed on each of the first and second sides. The interface material is in contact with the heat generating component adjacent the first side of the carrier. A gasket is mounted on the carrier on each of the first and second sides. A first portion of the gasket is sealingly engaged with the heat generating component and is positioned between the interface material and the peripheral edge. A heat sink is engaged with the interface material adjacent the second side of the carrier. A second portion of the gasket is sealingly engaged with the heat sink and is positioned between the interface material and the peripheral edge.

Still another embodiment provides a computer system including a chassis, a microprocessor mounted in the chassis, an input coupled to provide input to the microprocessor, a mass storage coupled to the microprocessor, a display coupled to the microprocessor by a video controller and a memory coupled to provide storage to facilitate execution of computer programs by the microprocessor. A circuit board is mounted in the chassis and a heat generating component is mounted on the circuit board. A self-contained flowable thermal interface material module is mounted on the component. The module includes a carrier having a first side, a second side, an opening formed therethrough and a continuous peripheral edge. A thermal interface material is mounted in the opening and is exposed on each of the first and second sides. The interface material is in contact with the heat generating component adjacent the first side of the carrier. A gasket is mounted on the carrier on each of the first and second sides. A first portion of the gasket is sealingly engaged with the heat generating component and is positioned between the interface material and the peripheral edge. A heat sink is engaged with the interface material adjacent the second side of the carrier. A second portion of the gasket is sealingly engaged with the heat sink and is positioned between the interface material and the peripheral edge.

A further embodiment provides a method of providing a thermal interface module in a computer system. The method includes mounting a heat generating component on a circuit board. A carrier is mounted adjacent the heat generating component. The carrier has opposite sides. A flowable thermal interface material is mounted on the carrier to extend from the opposite sides. A first portion of the interface material engages the heat generating component. A gasket is mounted on the carrier to extend from the opposite sides and is positioned between the interface material and a continuous peripheral edge of the carrier. A first portion of the gasket is sealingly engaged with the heat generating component. A heat sink is mounted adjacent the carrier in sealing engagement with a second portion of the interface material and a second portion of the gasket.

As it can be seen, the principal advantages of these embodiment are that a pre-measured FTIM carrier can be provided in modular form. The module can include a positioning feature for accurate location of the interface material relative to a heat generating component. A gasket seals and contains the interface material in a reservoir on each side of the carrier, and maintains the material in contact with the heat generating component and in contact with the heat sink. The modular form provides for easier installation on the assembly line and avoids seal problems when replacing a used module which has endured thermal cycling.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A thermal interface material module comprising:
   a carrier having opposite sides, a peripheral edge and an opening extending between the opposite sides;
   a flowable thermal interface material mounted in the opening of the carrier, a portion of the interface material being exposed sufficiently to flow on each of the opposite sides in response to heating the interface material; and
   a gasket mounted on the carrier including a continuous portion of the gasket exposed on each of the opposite sides, the gasket being positioned between the interface material and the peripheral edge to contain the interface material on the opposite sides of the carrier.

2. The module as defined in claim 1 wherein the carrier includes positioning apertures formed therein.

3. The module as defined in claim 1 wherein the gasket is formed of a sealing material.

4. A self-contained flowable thermal interface material module comprising:
   a carrier having opposite sides and an opening formed therethrough and including a continuous peripheral edge;
   a flowable thermal interface material mounted in the opening and exposed sufficiently to flow on each of the opposite sides in response to heating the interface material; and
   a gasket mounted on the carrier including a continuous portion of the gasket exposed on each of the opposite sides, the gasket being positioned between the interface material and the peripheral edge to contain the interface material on the opposite sides of the carrier.

5. The module as defined in claim 4 wherein the carrier includes positioning apertures formed therein.

6. The module as defined in claim 4 wherein the gasket is formed of a sealing material.

7. A chip assembly comprising:
   a circuit board;
   a heat generating component mounted on the circuit board;
   a self-contained flowable thermal interface material module mounted on the component, the module comprising:
      a carrier having opposite sides and an opening formed therethrough and including a continuous peripheral edge;
      a flowable thermal interface material mounted in the opening and exposed sufficiently to flow on each of the opposite sides in response to heating the interface material, the interface material being in contact with the heat generating component adjacent a first side of the carrier;
      a continuous gasket mounted on the carrier on each of the opposite sides, a first portion of the gasket being sealingly engaged with a portion of the heat generating component and positioned between the interface material and the peripheral edge; and
      a heat sink engaged with the interface material adjacent a second side of the carrier, a second portion of the gasket being sealingly engaged with the heat sink and positioned between the interface material and the peripheral edge, whereby the first and second portions of the gasket contain the interface material on the opposite sides of the carrier.

8. The assembly as defined in claim 7 wherein the carrier includes positioning apertures formed therein.

9. The assembly as defined in claim 7 wherein the gasket is formed of a sealing material.

10. A computer system comprising;
    a chassis;
    a microprocessor mounted in the chassis;
    an input coupled to provide input to the microprocessor;
    a mass storage coupled to the microprocessor;
    a video controller coupled to the microprocessor;
    a memory coupled to provide storage to facilitate execution of computer programs by the microprocessor;
    a circuit board mounted in the chassis;
    a heat generating component mounted on the circuit board;
    a self-contained flowable thermal interface material module mounted on the component, the module comprising:
       a carrier having opposite sides and an opening formed therethrough and including a continuous peripheral edge;
       a flowable thermal interface material mounted in the opening and exposed sufficiently to flow on each of the opposite sides in response to heating the interface material, the interface material being in contact with the heat generating component adjacent a first side of the carrier;
       a gasket mounted on the carrier on each of the opposite sides, a continuous first portion of the gasket being sealingly engaged with a portion of the heat generating component and positioned between the interface material and the peripheral edge; and
       a heat sink engaged with the interface material adjacent a second side of the carrier, a continuous second portion of the gasket being sealingly engaged with the heat sink and positioned between the interface material and the peripheral edge, whereby the first and second portions of the gasket contain the interface material on the opposite sides of the carrier.

11. The system as defined in claim 9 wherein the carrier includes positioning apertures formed therein.

12. The system as defined in claim 9 wherein the gasket is formed of a sealing material.

13. A method of providing a thermal interface module in a computer system comprising the steps of:

mounting a heat generating component on a circuit board;

mounting a carrier adjacent the heat generating component, the carrier having opposite sides and an opening extending between the opposite sides;

mounting a flowable thermal interface material in the opening of the carrier to extend sufficiently to flow on the opposite sides in response to heating the interface material, a first portion of the interface material engaging the heat generating component;

mounting a gasket on the carrier to extend from the opposite sides and positioned between the interface material and a continuous peripheral edge of the carrier;

sealingly engaging a continuous first portion of the gasket with a portion of the heat generating component; and mounting a heat sink adjacent the carrier in sealing engagement with a second portion of the interface material and a continuous second portion of the gasket, whereby the interface material is contained on the opposite sides of the carrier.

* * * * *